(12) United States Patent
Ikeda

(10) Patent No.: US 11,108,370 B2
(45) Date of Patent: Aug. 31, 2021

(54) FILTER CIRCUIT AND AMPLIFIER CIRCUIT

(71) Applicant: KABUSHIKI KAISHA TOSHIBA, Minato-ku (JP)

(72) Inventor: Kentaro Ikeda, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 68 days.

(21) Appl. No.: 16/563,029

(22) Filed: Sep. 6, 2019

(65) Prior Publication Data

US 2020/0220515 A1    Jul. 9, 2020

(30) Foreign Application Priority Data

Jan. 4, 2019   (JP) ............................ JP2019-000270

(51) Int. Cl.
     *H03F 3/45*       (2006.01)
     *H03H 7/01*       (2006.01)
     *H03H 9/24*       (2006.01)

(52) U.S. Cl.
     CPC ....... *H03H 7/0161* (2013.01); *H03F 3/45071* (2013.01); *H03H 9/24* (2013.01)

(58) Field of Classification Search
     CPC .. H03H 7/0161; H03H 9/24; H03H 2210/025; H03H 7/07; H03F 3/45071; H03F 3/45475

USPC ................................ 330/277, 302, 251–262
See application file for complete search history.

(56) References Cited

U.S. PATENT DOCUMENTS 5,519,349 A    5/1996   Nakahara
8,970,293 B1 *   3/2015   Salvi .................... H03H 11/126
                                                                       327/553

FOREIGN PATENT DOCUMENTS

| JP | 7-99425 A | 4/1995 |
| JP | 8-51336 A | 2/1996 |
| JP | 8-321736 A | 12/1996 |
| JP | 2007-158927 A | 6/2007 |
| JP | 2007-159075 A | 6/2007 |

\* cited by examiner

*Primary Examiner* — Hieu P Nguyen
(74) *Attorney, Agent, or Firm* — Oblon, McClelland, Maier & Neustadt, L.L.P.

(57) ABSTRACT

A filter circuit has a first resistor which is connected between an input node and an output node, a second resistor which is connected between the output node and a reference potential node, a first capacitor and a second capacitor which are connected in series between the input node and the output node, and a variable capacity part which is connected between a connection node of the first capacitor and the second capacitor and the reference potential node.

19 Claims, 5 Drawing Sheets

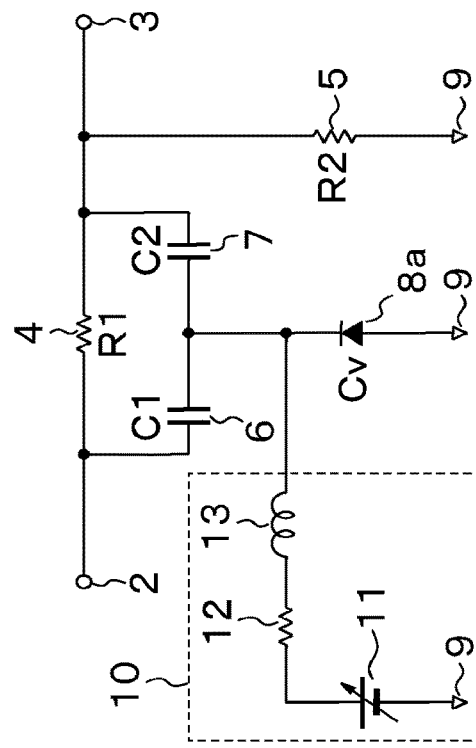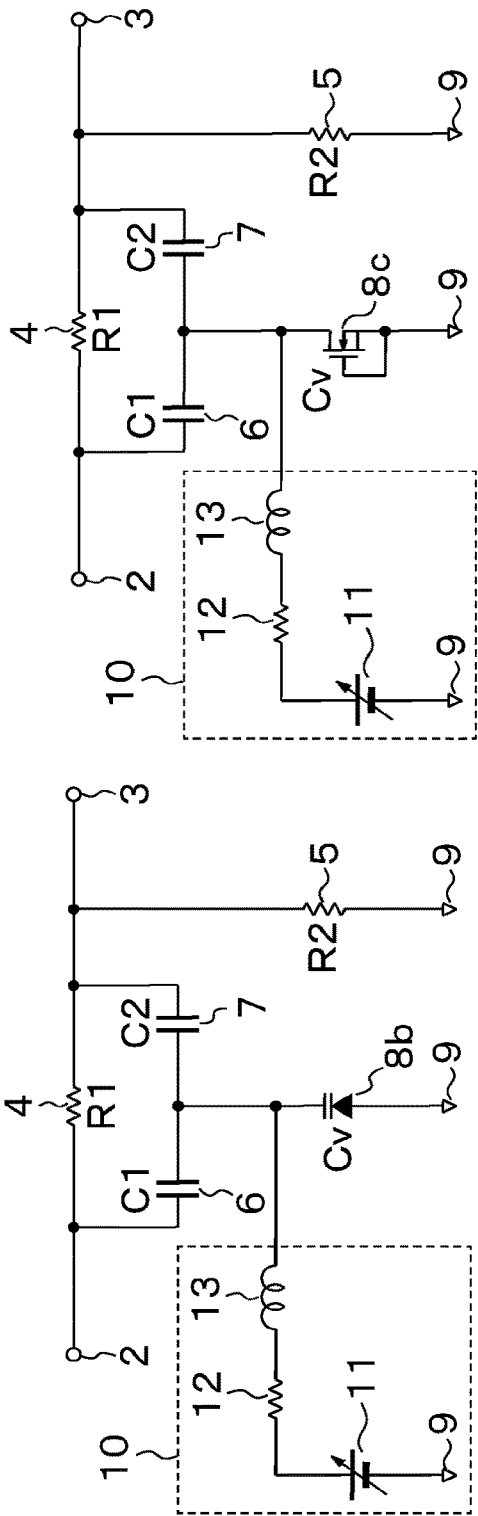
FIG. 3A
FIG. 3B
FIG. 3C

FILTER CIRCUIT AND AMPLIFIER CIRCUIT

CROSS REFERENCE TO RELATED APPLICATIONS

This application is based upon and claims the benefit of priority from the prior Japanese Patent Application No. 2019-270, filed on Jan. 4, 2019, the entire contents of which are incorporated herein by reference.

FIELD

Embodiments of the present disclosure relate to a filter circuit and an amplifier circuit.

BACKGROUND

In the related art, a filter circuit has a problem that a frequency band in which a signal can pass is fixed, and the frequency band is not switched freely. For example, a low-pass filter cannot be changed into a high-pass filter without changing a circuit configuration, and the high-pass filter cannot be changed into the low-pass filter without changing the circuit configuration.

A gain or a phase of the signal passing through the filter circuit cannot be changed continuously.

However, if various circuits are designed, and a filter property such as a pass frequency band of the filter circuit included in the circuits can be switched, a circuit design becomes easy, and a plurality of filter circuits each having different filter properties are not required. Thus, the circuit scale can be reduced.

BRIEF DESCRIPTION OF THE DRAWINGS

FIGS. 3A, 3B, and 3C are views illustrating specific examples of a filter circuit including a bias circuit;

DETAILED DESCRIPTION

According to one embodiment, a filter circuit has a first resistor which is connected between an input node and an output node, a second resistor which is connected between the output node and a reference potential node, a first capacitor and a second capacitor which are connected in series between the input node and the output node, and a variable capacity part which is connected between a connection node of the first capacitor and the second capacitor and the reference potential node.

Hereinafter, embodiments of the present disclosure will be described with reference to the drawings. In the following embodiments, the description will be given mainly about characteristic configurations and operations in a filter circuit and an amplifier circuit. However, the filter circuit and the amplifier circuit may include configurations and operations omitted in the descriptions below.

Figure 1:
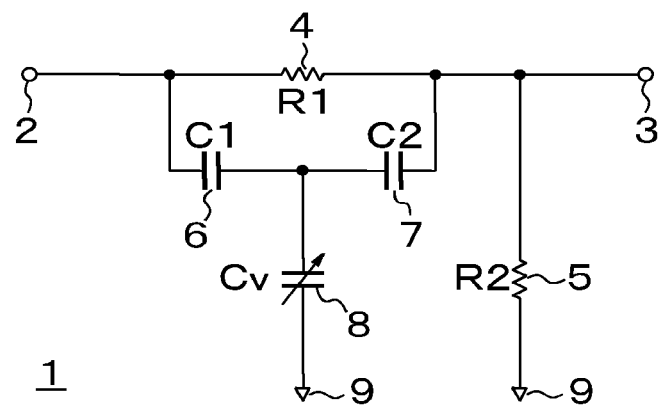
FIG. 1 is a circuit diagram illustrating a circuit configuration of a filter circuit according to one embodiment.

FIG. 1 is a circuit diagram illustrating a circuit configuration of a filter circuit 1 according to one embodiment. The filter circuit 1 of FIG. 1 is characterized in that a filter property such as a pass frequency band can be switched continuously or intermittently. The filter circuit 1 of FIG. 1 is not limited to particular purposes. The filter circuit 1 can be used for general purposes in various circuits requiring the filter circuit 1.

The filter circuit 1 of FIG. 1 filters a signal input to an input node 2 and outputs the signal from an output node 3. The filtering means to mainly allow a signal within a predetermined pass frequency band to pass. The filter circuit 1 of FIG. 1 includes a first resistor 4, a second resistor 5, a first capacitor 6, a second capacitor 7, and a variable capacity part 8.

The first resistor 4 is connected between the input node 2 and the output node 3. The second resistor 5 is connected between the output node 3 and a reference potential node 9. For example, the reference potential node 9 is a grounding node. In this way, in a case where a DC input signal is input to the input node 2, the output signal output from the output node 3 becomes a signal obtained by resistor-dividing the input signal by the first resistor 4 and the second resistor 5. For example, in a case where the first resistor 4 and the second resistor 5 have the same resistance value, the output signal having a half of the signal level of the DC input signal is output from the output node 3. This means that the signal level of the output signal decreases from that of the input signal by 6 dB.

The first capacitor 6 and the second capacitor 7 are connected in series between the input node 2 and the output node 3. That is, a series circuit configured by the first capacitor 6 and the second capacitor 7 is connected in parallel with the first resistor 4.

The variable capacity part 8 is connected between a connection node of the first capacitor 6 and the second capacitor 7 and the reference potential node 9. The variable capacity part 8 can switch a capacitance continuously or intermittently. As described below, the variable capacity part 8 can be configured by a varicap, a diode, a MOS transistor, and the like. By the control of the capacitance of the variable capacity part 8, the frequency band of the output signal to be output from the output node 3 is switched with respect to an AC input signal input to the input node 2. In FIG. 1, the capacitance of the first capacitor 6 is denoted by C1, the capacitance of the second capacitor 7 is denoted by C2, and the capacitance of the variable capacity part 8 is denoted by Cv.

Next, the operation of the filter circuit 1 of FIG. 1 will be described. When a DC input signal is input to the input node 2, the input signal does not flow through the first capacitor 6 and the second capacitor 7. Thus, the output signal obtained by resistor-dividing the input signal by the first resistor 4 and the second resistor 5 is output from the output node 3. When the resistance value of the first resistor 4 is denoted by R1, and the resistance value of the second resistor 5 is denoted by R2, the output signal has a signal level obtained by attenuating the input signal at an attenuation ratio $R1/(R1+R2)$.

In this way, in a case where the DC input signal is input to the input node 2, regardless of the capacitor of the variable capacity part 8, the output signal obtained by attenuating the input signal at the attenuation ratio corresponding to the resistance values of the first resistor 4 and the second resistor 5 is output from the output node 3.

Next, consideration is taken into a case where the AC input signal is input to the input node 2. When the capacitance Cv of the variable capacity part 8 is less than a predetermined value, as the capacitance Cv of the variable capacity part 8 becomes smaller, and the frequency of the AC input signal input to the input node 2 becomes higher, the input signal becomes easier to flow through the first capacitor 6 and the second capacitor 7 compared to the first resistor 4. Thus, the filter circuit operates as a high-pass filter. Herein, for example, the predetermined value means the capacitance C2 of the second capacitor 7.

As the frequency of the input signal increases, the input signal becomes easier to flow through the first capacitor 6 compared to the first resistor 4. In a case where the capacitance Cv of the variable capacity part 8 is smaller than the capacitance C2 of the second capacitor 7, the input signal flowing through the first capacitor 6 does not flow through the variable capacity part 8 but flows through the second capacitor 7 to reach the output node 3. As the capacitance Cv of the variable capacity part 8 becomes smaller, the input signal passing through the first capacitor 6 becomes easier to flow through the second capacitor 7.

In this way, in a case where the capacitance Cv of the variable capacity part 8 is less than the predetermined value, as the capacitance Cv of the variable capacity part 8 becomes smaller, and the frequency of the input signal becomes higher, the input signal becomes easier to pass through the first capacitor 6 and the second capacitor 7. Thus, the filter circuit operates as the high-pass filter.

On the other hand, when the capacitance Cv of the variable capacity part 8 is equal to or more than the predetermined value, the input signal which is input from the input node 2 to flow through the first capacitor 6 becomes easier to flow through the variable capacity part 8 compared to the second capacitor 7. As the capacitance Cv of the variable capacity part 8 is larger than the capacitance C2 of the second capacitor 7, the input signal passing through the first capacitor 6 becomes easier to flow through the variable capacity part 8.

Since the signal flowing through the variable capacity part 8 flows through the reference potential node 9, the input signal is blocked. As the capacitance Cv of the variable capacity part 8 becomes larger, and the frequency of the input signal becomes higher, the input signal becomes easier to flow from the first capacitor 6 to the variable capacity part 8. Thus, the filter circuit operates as the low-pass filter.

Figure 2:
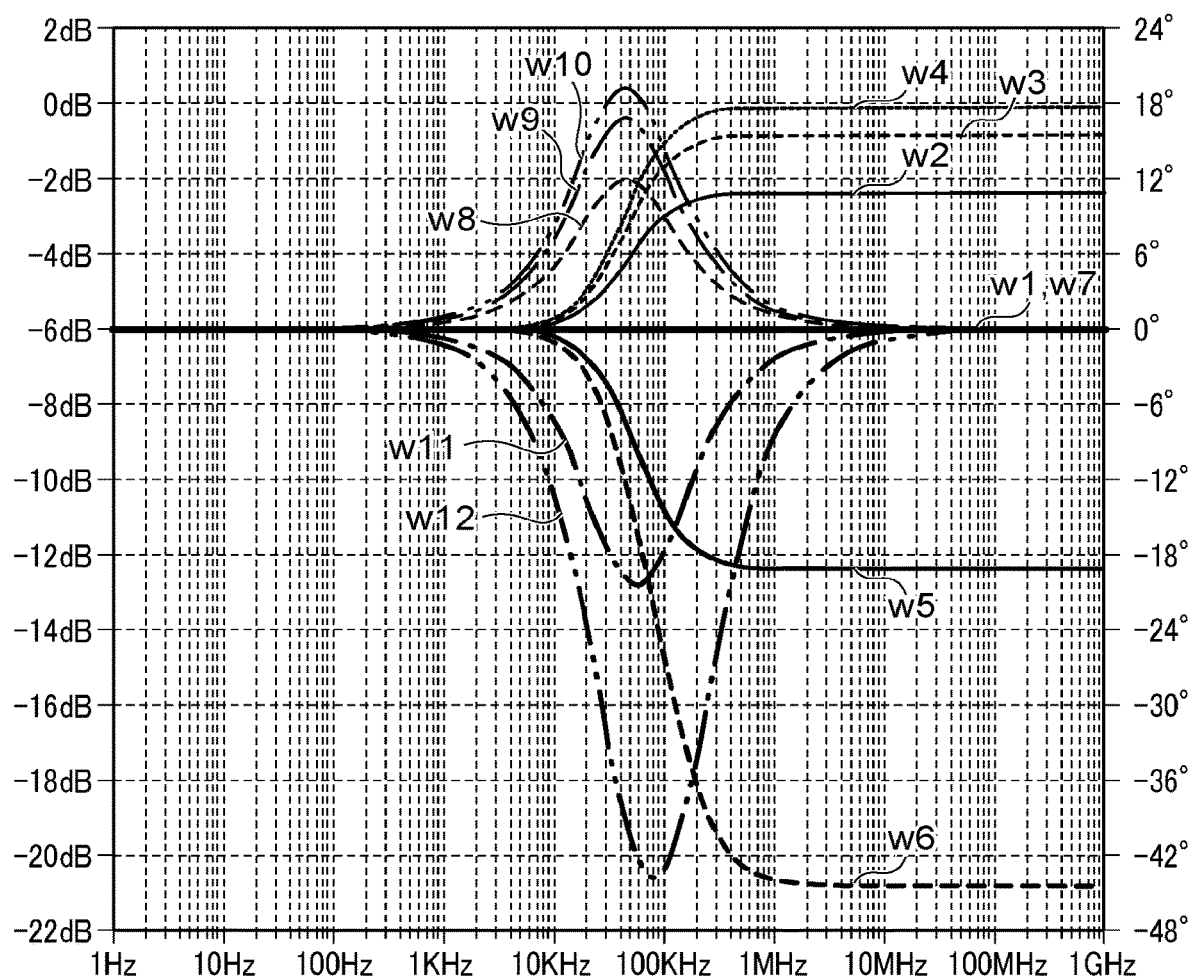
FIG. 2 is a waveform diagram obtained by simulating an operation of a filter circuit 1 of FIG. 1.

FIG. 2 is a waveform diagram obtained by simulating the operation of the filter circuit 1 of FIG. 1 and illustrates a waveform of the output signal. In simulating the operation of the filter circuit 1 of FIG. 2, the resistance values of the first resistor 4 and the second resistor 5 are equal to each other, and the capacitances C1 and C2 of the first capacitor 6 and the second capacitor 7 are also equal to each other. In addition, the capacitance Cv of the variable capacity part 8 is changed intermittently to a predetermined range (for example, 10 pF to 10 nF). In FIG. 2, a horizontal axis is a frequency, a vertical axis at the left end is a signal level, and a vertical axis at the right end is a phase.

A linear waveform w1 of −6 dB is a waveform of the output signal corresponding to the DC input signal. In the case, the output signal has a signal level which is a half of the signal level of the input signal.

Waveforms w2 to w4 above the linear waveform w1 indicate the property of the high-pass filter, and waveforms w5 and w6 therebelow indicate the property of the low-pass filter. More specifically, in a case where the capacitance Cv of the variable capacity part 8 is less than the predetermined value, as the capacitance Cv of the variable capacity part 8 becomes smaller, and the frequency of the input signal becomes higher, the first capacitor 6 and the second capacitor 7 allow the input signal to pass therethrough more easily. Thus, the signal level of the output signal becomes higher. Accordingly, as a waveform is an upper one among the waveforms w2 to w4 above the linear waveform w1 of −6 dB, the capacitance Cv of the variable capacity part 8 becomes smaller.

In a case where the capacitance Cv of the variable capacity part 8 is equal to or more than the predetermined value, as the capacitance Cv of the variable capacity part 8 becomes larger, and the frequency of the input signal becomes higher, the first capacitor 6 and the variable capacity part 8 allow the input signal to pass therethrough more easily. Thus, the input signal is blocked. Accordingly, as a waveform is a lower one among the waveforms w5 and w6 below the linear waveform w1 of −6 dB, the capacitance Cv of the variable capacity part 8 becomes larger.

Broken-line waveforms w7 to w12 of FIG. 2 indicate the phases of the output signal. In a case where the DC input signal is input to the input node 2, the phase becomes a linear waveform w7. Waveforms w8 to w10 above the linear waveform w7 indicate the phases of the output signal in a case where the capacitance Cv of the variable capacity part 8 is less than the predetermined value. As the capacitance Cv of the variable capacity part 8 becomes smaller, and the frequency of the input signal becomes higher, the phase advances further.

Waveforms w11 and w12 below the linear waveform w7 indicate the phases of the output signal in a case where the capacitance Cv of the variable capacity part 8 is equal to or more than the predetermined value. As the capacitance Cv of the variable capacity part 8 becomes larger, and the frequency of the input signal becomes higher, the phase lags further.

For example, the control of the capacitance Cv of the variable capacity part 8 is performed by a bias circuit. FIGS. 3A, 3B, and 3C are views illustrating specific examples of the filter circuit 1 including a bias circuit 10.

The filter circuit 1 of FIG. 3A includes a diode 8a as the variable capacity part 8. In the diode 8a, an anode is connected to the reference potential node 9, and a cathode is connected to the output node of the bias circuit 10 and the connection node of the first capacitor 6 and the second capacitor 7.

The bias circuit 10 includes a DC variable voltage source 11, a third resistor 12, and an inductor 13 which are connected in series between a reference potential node 9 and the connection node of the first capacitor 6 and the second capacitor 7. A DC bias voltage passing through the inductor 13 is applied to the variable capacity part 8.

The reason for providing the inductor 13 is to prevent that a part of the AC input signal passing through the first capacitor 6 to the variable capacity part 8 flows toward the bias circuit 10. Since the inductor 13 allows a DC signal to pass therethrough but does not allow an AC signal to pass therethrough, the inductor 13 is provided to prevent that the AC input signal passing through the first capacitor 6 to the variable capacity part 8 flows in the bias circuit 10.

FIG. 3B is a view in which the diode 8a of FIG. 3A is changed into a varicap 8b. Both the diode 8a and the varicap 8b have a capacitance corresponding to the voltage level of the DC bias voltage by applying a voltage (DC bias voltage) higher than that of the anode to the cathode.

FIG. 3C is a view in which the diode 8a of FIG. 3A is changed into a MOS transistor 8c. The DC bias voltage is applied to the drain of the MOS transistor 8c. In addition, the source and the gate of the MOS transistor 8c are short-circuited, and the MOS transistor 8c equivalently operates as the diode 8a.

The variable capacitance element illustrated in FIGS. 3A to 3C is one example, and a micro electronic mechanical system (MEMS) variable capacitance element or a multi-stage variable capacitance circuit using a switch may be used.

Figure 4:
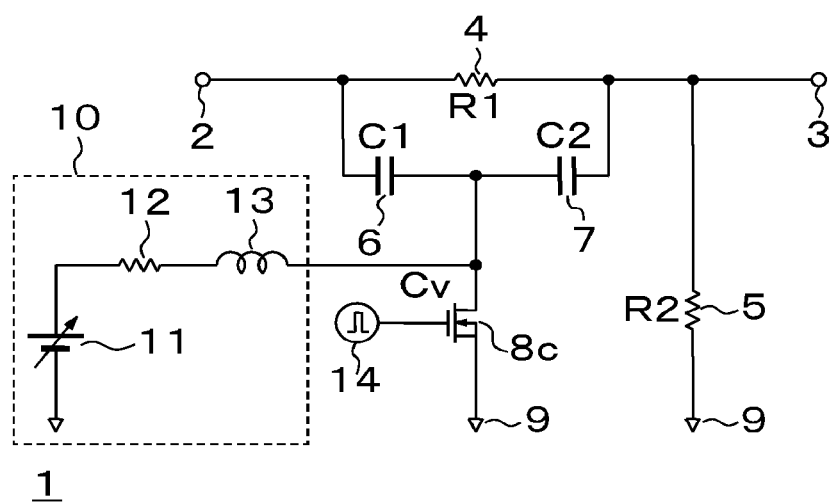
FIG. 4 is a circuit diagram illustrating a circuit configuration of a filter circuit according to one modification.

FIG. 4 is a circuit diagram illustrating the circuit configuration of the filter circuit 1 according to one modification. The filter circuit 1 of FIG. 4 uses the MOS transistor 8c as the variable capacity part 8 and includes an AC block control part 14. The DC bias voltage from the bias circuit 10 is applied to the drain of the MOS transistor 8c, and the source is connected to the reference potential node 9.

The AC block control part 14 inputs a signal for switching ON and OFF of the MOS transistor 8c to the gate of the MOS transistor 8c. When the signal is a high-level signal, the MOS transistor 8c is turned on, and the input signal is not transmitted to the second capacitor 7 side. In this case, the filter circuit 1 operates as the low-pass filter.

The filter circuit 1 according to the present embodiment can be used in various circuits incorporating the filter circuit 1. For example, the filter circuit can be used as an oscillation circuit using a phased locked loop (PLL) circuit or the like, a signal processing circuit, a phase compensation circuit which performs an oscillation control of an amplifier, a phase difference circuit, a tuning circuit, or the like.

Figure 5:
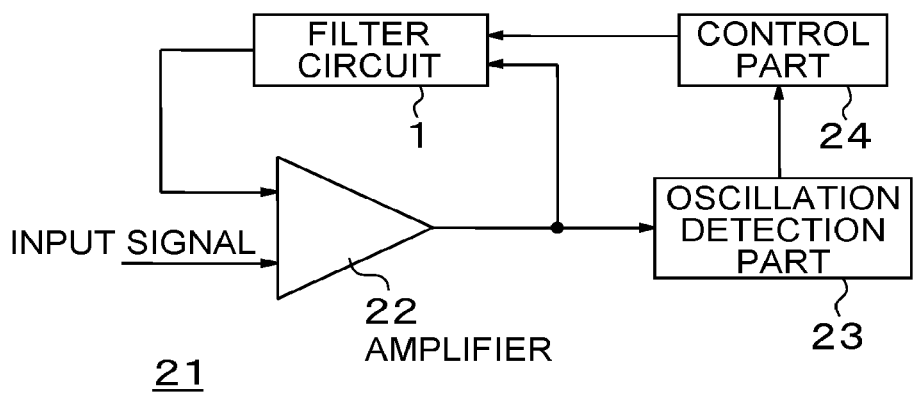
FIG. 5 is a block diagram illustrating a schematic configuration of an amplifier circuit including the filter circuit according to the present embodiment.

FIG. 5 is a block diagram illustrating a schematic configuration of an amplifier circuit 21 including the filter circuit 1 according to the present embodiment. The amplifier circuit 21 of FIG. 5 includes the filter circuit 1 according to the present embodiment, an amplifier 22, an oscillation detection part 23, and a control part 24.

The amplifier 22 amplifies a differential signal of the input signal and the output signal of the filter circuit 1. The amplifier 22 is a differential amplifier such as an operational amplifier. The amplifier circuit 21 of FIG. 5 automatically suppresses the oscillation by feedback-controlling an amplified signal output from the amplifier 22 by using the filter circuit 1.

The oscillation detection part 23 detects whether the amplified signal output from the amplifier 22 is oscillated or not. The oscillation detection part 23 may detect two states of a state where the amplified signal is oscillated and a state where the amplified signal is not oscillated and may output a signal corresponding to the size of the oscillation of the amplified signal as an analog value, for example.

The control part 24 generates a control signal for controlling the capacitance Cv of the variable capacity part 8 on the basis of the detection result of the oscillation detection part 23. The control part 24 may contain a correspondence relation of the size of the oscillation of the amplified signal and the control signal in a table.

The variable capacity part 8 in the filter circuit 1 adjusts the capacitance according to the control signal output from the control part 24. The amplified signal amplified by the amplifier 22 is input to the input node 2 of the filter circuit 1. The output signal obtained by filtering the amplified signal by the frequency property corresponding to the capacitance Cv of the variable capacity part 8 is output from the output node 3 of the filter circuit 1.

In the amplifier circuit 21 of FIG. 5, the pass frequency band of the filter circuit 1 can be switched randomly. Thus, even when the amplified signal output from the amplifier 22 is oscillated, the oscillation can be quickly suppressed by switching the pass frequency band of the filter circuit 1.

In this way, the filter circuit 1 according to the present embodiment includes the variable capacity part 8 connected between the connection node of the first capacitor 6 and the second capacitor 7 and the reference potential node 9. Thus, the pass frequency band of the filter circuit 1 can be switched randomly by controlling the capacitance Cv of the variable capacity part 8. Accordingly, in the present embodiment, the same filter circuit 1 can be used as a high-pass filter, a low-pass filter, or a band-pass filter as needed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A filter circuit comprising:
a first resistor which is connected between an input node and an output node;
a second resistor which is connected between the output node and a reference potential node;
a first capacitor and a second capacitor which are connected in series between the input node and the output node; and
a variable capacity part which is connected between a connection node of the first capacitor and the second capacitor and the reference potential node,
wherein the first resistor is connected in parallel to the first capacitor and the second capacitor which are connected in series.

2. The filter circuit according to claim 1, wherein
a frequency band of an output signal to be output from the output node is switched with respect to an AC input signal input to the input node by a control of a capacitance of the variable capacity part.

3. The filter circuit according to claim 1, wherein
when a capacitance of the variable capacity part is less than a predetermined value, as the capacitance of the variable capacity part is smaller, and a frequency of an AC input signal input to the input node is higher, the AC input signal becomes easier to flow through the first capacitor and the second capacitor compared to the first resistor, whereby the filter circuit operates as a high-pass filter.

4. The filter circuit according to claim 1, wherein
when a capacitance of the variable capacity part is equal to or more than a predetermined value, as a capacitance of the variable capacity part is larger, and a frequency of an AC input signal input to the input node is higher, the AC input signal becomes easier to flow from the first capacitor through the variable capacity part to the reference potential node, whereby the filter circuit operates as a low-pass filter.

5. The filter circuit according to claim 1, further comprising:
a bias circuit which applies a DC bias voltage to the variable capacity part.

6. The filter circuit according to claim 5, wherein
the bias circuit includes a DC variable voltage source in which a DC voltage level is variable, a third resistor, and an inductor which are connected in series between the reference potential node and the connection node, and the DC bias voltage passing through the inductor is applied to the connection node.

7. The filter circuit according to claim 5, wherein
the variable capacity part includes a diode or a varicap which includes a cathode to which the DC bias voltage is applied and an anode connected to the reference potential node.

8. The filter circuit according to claim 5, wherein
the variable capacity part includes a transistor which includes a drain to which the DC bias voltage is applied and a gate and a source which are connected to the reference potential node.

9. The filter circuit according to claim 5, wherein
the variable capacity part includes
a transistor which includes a drain to which the DC bias voltage is applied and a source which is connected to the reference potential node, and
an AC block control part which inputs a signal for switching ON or OFF of the transistor to a gate of the transistor.

10. An amplifier circuit comprising:
a filter circuit;
an amplifier which amplifies a differential signal of an input signal and an output signal of the filter circuit;
an oscillation detection part which detects whether an amplified signal output from the amplifier is oscillated or not; and
a control part which generates a control signal for controlling the filter circuit on the basis of a detection result of the oscillation detection part, wherein
the filter circuit includes
a first resistor which is connected between an input node and an output node,
a second resistor which is connected between the output node and a reference potential node,
a first capacitor and a second capacitor which are connected in series between the input node and the output node, and
a variable capacity part which is connected between a connection node of the first capacitor and the second capacitor and the reference potential node, and
the filter circuit outputs the output signal corresponding to the amplified signal input to the input node from the output node to input the output signal to the amplifier in a state where a capacitance of the variable capacity part is adjusted according to the control signal.

11. The amplifier circuit according to claim 10, wherein
a frequency band of an output signal to be output from the output node is switched with respect to an AC input signal input to the input node by a control of a capacitance of the variable capacity part.

12. The amplifier circuit according to claim 10, wherein
when a capacitance of the variable capacity part is less than a predetermined value, as the capacitance of the variable capacity part is smaller, and a frequency of an AC input signal input to the input node is higher, the AC input signal becomes easier to flow through the first capacitor and the second capacitor compared to the first resistor, whereby the filter circuit operates as a high-pass filter.

13. The amplifier circuit according to claim 10, wherein
when a capacitance of the variable capacity part is equal to or more than a predetermined value, as a capacitance of the variable capacity part is larger, and a frequency of an AC input signal input to the input node is higher, the AC input signal becomes easier to flow from the first capacitor through the variable capacity part to the reference potential node, whereby the filter circuit operates as a low-pass filter.

14. The amplifier circuit according to claim 10, further comprising:
a bias circuit which applies a DC bias voltage to the variable capacity part.

15. The amplifier circuit according to claim 14, wherein
the bias circuit includes a DC variable voltage source in which a DC voltage level is variable, a third resistor, and an inductor which are connected in series between the reference potential node and the connection node, and the DC bias voltage passing through the inductor is applied to the connection node.

16. The amplifier circuit according to claim 14, wherein
the variable capacity part includes a diode or a varicap which includes a cathode to which the DC bias voltage is applied and an anode connected to the reference potential node.

17. The amplifier circuit according to claim 14, wherein
the variable capacity part includes a transistor which includes a drain to which the DC bias voltage is applied and a gate and a source which are connected to the reference potential node.

18. The amplifier circuit according to claim 14, wherein
the variable capacity part includes
a transistor which includes a drain to which the DC bias voltage is applied and a source which is connected to the reference potential node, and
an AC block control part which inputs a signal for switching ON or OFF of the transistor to a gate of the transistor.

19. The amplifier circuit according to claim 10, wherein
the first resistor is connected in parallel to the first capacitor and the second capacitor which are connected in series.

* * * * *